(12) United States Patent
Kenington (10) Patent No.: US 9,306,610 B2
(45) Date of Patent: Apr. 5, 2016

(54) ACTIVE ANTENNA ARRAY FOR A MOBILE COMMUNICATIONS NETWORK WITH A PLURALITY OF GAIN SWITCHES AND A METHOD FOR ADJUSTING A SIGNAL LEVEL OF INDIVIDUAL RADIO SIGNALS

(71) Applicant: Peter Kenington, Chepstow (GB)

(72) Inventor: Peter Kenington, Chepstow (GB)

(73) Assignee: KATHREIN-WERKE KG, Rosenheim (DE)

( * ) Notice: Subject to any disclaimer, the term of this patent is extended or adjusted under 35 U.S.C. 154(b) by 0 days.

(21) Appl. No.: 13/915,082

(22) Filed: Jun. 11, 2013

(65) Prior Publication Data
US 2013/0273868 A1    Oct. 17, 2013

Related U.S. Application Data

(63) Continuation of application No. 12/650,004, filed on Dec. 30, 2009, now abandoned.

(51) Int. Cl.
| | |
|---|---|
| *H04B 1/06* | (2006.01) |
| *H04B 1/18* | (2006.01) |
| *H01Q 3/26* | (2006.01) |
| *H03M 1/12* | (2006.01) |

(Continued)

(52) U.S. Cl.
CPC .. *H04B 1/18* (2013.01); *H01Q 3/26* (2013.01); *H03M 1/123* (2013.01); *H03M 3/466* (2013.01); *H03M 1/185* (2013.01); *H03M 3/49* (2013.01)

(58) Field of Classification Search
CPC ....... H01Q 1/523; H01Q 3/26; H01Q 3/2605; H01Q 3/247; H01Q 3/2617; H04B 7/04; H04B 7/15; H04B 7/0408; H04B 7/0413; H04B 7/0814; H04B 7/0817; H04B 7/084; H04B 7/0802; H04B 7/634; H04B 7/0871; H04B 7/0874; H04B 1/18; H04W 84/12; H03M 1/123; H03M 3/466; H03M 3/49; H03M 1/185; H03F 1/52
USPC ........ 455/101, 132, 103, 127.3, 232.1, 234.2, 455/239.1, 240.1, 245.2, 246.1, 247.1, 455/249.1, 562.1, 575.7, 136, 272, 273; 342/368, 375, 379

See application file for complete search history.

(56) References Cited

U.S. PATENT DOCUMENTS

| | | | | |
|---|---|---|---|---|
| 6,804,308 | B1 * | 10/2004 | Claxton et al. | ................ 375/316 |
| 7,062,244 | B2 * | 6/2006 | Gharpurey et al. | ........ 455/242.1 |
| 7,260,370 | B2 * | 8/2007 | Wang et al. | ................... 455/135 |

(Continued)

FOREIGN PATENT DOCUMENTS

JP    2003152611 A  *  5/2003

*Primary Examiner* — Yuwen Pan
*Assistant Examiner* — Fatuma Sherif
(74) *Attorney, Agent, or Firm* — Stephen H. Eland; Dann, Dorfman, Herrell & Skillman (57) ABSTRACT

An active antenna array for a mobile communications network and a method for receiving radio signals is disclosed. The active antenna array has a plurality of antenna elements for relaying radio signals, a plurality of first amplifiers for amplifying a plurality of individual receive signals a plurality of first analog-to-digital converters and a plurality of first gain switches located between one of the plurality of first analog-to-digital converters and the plurality of first amplifiers. A digital signal processor is connected to outputs of the plurality of first analog-to-digital converters and has a common gain switch control line connected to at least two of the plurality of first switches for controlling the gain of the first gain switches.

21 Claims, 4 Drawing Sheets

(51) Int. Cl.
*H03M 3/00* (2006.01)
*H03M 1/18* (2006.01)

(56) References Cited

U.S. PATENT DOCUMENTS

2003/0186665 A1* 10/2003 Black et al. ............... 455/240.1
2004/0219899 A1* 11/2004 Ho et al. ..................... 455/273
2005/0255815 A1* 11/2005 Hammerschmidt et al. .. 455/132
2006/0148437 A1    7/2006 Krivokapic et al.
2007/0021080 A1*  1/2007 Kuriyama et al. ........... 455/132
2007/0066254 A1    3/2007 Tsuchie et al.
2007/0135071 A1*  6/2007 Lee et al. .................. 455/232.1
2008/0248770 A1* 10/2008 Schultz et al. ............. 455/188.1

* cited by examiner

ACTIVE ANTENNA ARRAY FOR A MOBILE COMMUNICATIONS NETWORK WITH A PLURALITY OF GAIN SWITCHES AND A METHOD FOR ADJUSTING A SIGNAL LEVEL OF INDIVIDUAL RADIO SIGNALS

PRIORITY CLAIM

This application is a continuation of U.S. patent application Ser. No. 12/650,004 filed Dec. 30, 2009. The entire disclosure of the foregoing application is hereby incorporated herein by reference.

BACKGROUND OF THE INVENTION

Current analogue to digital converters (ADC) do not have a sufficient dynamic range to process the full range of receive signals that the ADCs are likely to encounter in a mobile communications network radio base station. It is therefore known in the art to break down the likely range of receive signals into two or more sub-ranges of radio signals. Some form of gain control or gain switching is used to reduce the amplitude of the radio signal impinging upon the ADC in strong signal conditions. Each one of the switched receivers in the base station will have its own threshold level at which the gain of the receiver is switched (e. g. from "high" to "low" gain) and a (different) threshold level at which the gain changes in the reverse direction (i.e. from "low" to "high"). An element of hysteresis is deliberately build into the process of gain switching in order to prevent excessive amounts of gain control or gain switching from occurring when the receive signals are close to or at the threshold level.

Figure 1:
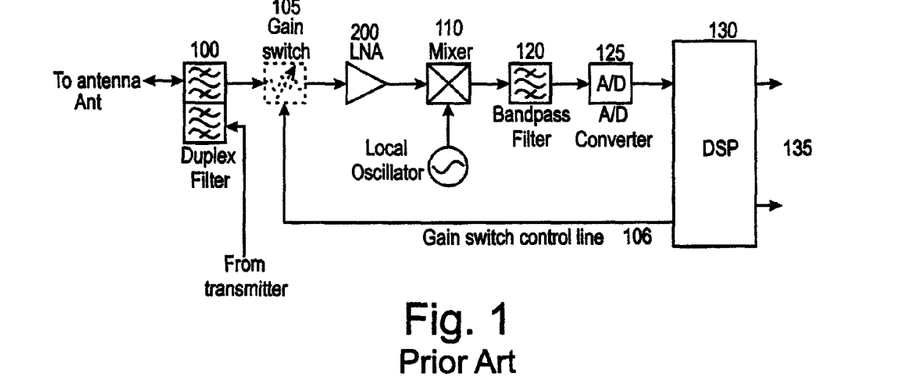
FIG. 1 shows a receiver system of the prior art.

FIG. 1 shows a prior art antenna array with a single downconversion stage. The receive signals are received at antenna elements Ant and passed to a duplex filter 100. The duplex filter 100 removes any unwanted out-off-band signals from the receive signals. The receive signals are passed through a gain switch 105. The gain switch 105 can either pass the receive signal unmodified or reduce the amplitude of the receive signal by adding attenuation to the receive signal. The gain switch 105 is connected by a gain switch control line 106 to an output of a digital signal processor 130. The amount of attenuation added to the receive signal is controlled by a signal along the gain switch control line 106 from the digital signal processor 130, as will be explained later.

The remainder of the receiver shown in FIG. 1 is a conventional single downconversion design with a low noise amplifier 200 receiving the receive signals (either unmodified or attenuated) from the gain switch 105 and passing the amplified (and possibly attenuated) receive signals to a mixer 110 which downconverts the amplified receive signals to a lower frequency. The downconverted receive signals are passed to a bandpass filter 120 to remove any unwanted out-off-band signals from the downconverted receive signals. The output of the bandpass filter 120 is connected to an analogue-to-digital converter 125 which converts the down converted signals in the analogue domain to the digital domain at a digital intermediate frequency. The digital signals are passed to the digital signal processor 130 and then output as baseband digital signals 135.

The ADC 125 has a limited dynamic range and the digital signal processor 130 will analyse the digital signals in order to determine if the ADC 125 is close to overloading or saturation. The digital signal processor 130 does this analysis by comparing the digital signal level output from the ADC 125 to a predetermined threshold level. If the threshold level is exceeded, the strength of the receive RF signals is reduced by switching in the attenuation in the gain switch 105. A typical six-sector radio base station will have six of these receivers (or twelve if diversity reception is applied). The presence of six identical receivers in the base station increases the amount of real estate required on a chip and in the base station for all six of the receivers and also requires sufficient processing power to ensure that all six of the receivers act in tandem with each other.

SUMMARY OF THE INVENTION

An active antenna array for a mobile communications network is disclosed which has a plurality of antenna elements for relaying radio signals. A plurality of first amplifiers for amplifying a plurality of individual receive signals and a plurality of first analogue-to-digital converters is included in the active antenna array. A plurality of first gain switches is located between one of the plurality of antenna elements and the plurality of first analogue to digital converters. A digital signal processor connected to outputs of the plurality of analogue-to-digital converters and has a common gain switch control line connected to at least two of the plurality of first switches. The digital signal processor can thus control the switching on or off of the first gain switches by monitoring the output from the plurality amplifiers.

It will be appreciated that the digital signal processor may not be connected directly to the outputs of the plurality of first amplifiers. There are likely to be further elements between the digital signal processor and the first amplifiers.

In some aspects of the invention, more than one gain switch, a multi-level gain switch or multi-stage gain switch is connected into each one of signal paths between the antenna elements and the digital signal processor. This enables a greater degree of flexibility to the switching.

A method for receiving a plurality of individual radio signals is also disclosed. This method comprises concurrently receiving the plurality of individual radio signals and centrally changing by a similar amount a signal level of the plurality of individual radio signals. The plurality of individual radio signals is converted from the analogue domain to the digital domain. The similar amount is in general substantially identical for each one of the individual radio signals.

A chip set is also disclosed which comprises a plurality of first amplifiers for amplifying a plurality of individual receive signals, a plurality of first analogue-to-digital converters, a plurality of first gain switches located prior to the plurality of first analogue-to-digital converters, and a digital signal processor connected to outputs of the plurality of amplifiers and having a common gain switch control line connected to at least two of the plurality of first switches.

A computer program product is also disclosed. The computer program product comprises a computer-usable medium having control logic stored therein for causing a computer to manufacture an active antenna array for a mobile communications network. The active antenna array comprises a plurality of antenna elements for relaying radio signals, a plurality of first amplifiers for amplifying a plurality of individual receive signals, a plurality of first analogue-to-digital converters, a plurality of first gain switches located between one of the plurality of antenna elements and the plurality of first analogue-to-digital converters, and a digital signal processor connected to outputs of the plurality of first analogue-to-digital converters and having a gain switch control line connected to at least one of the plurality of first switches.

Finally a computer program product is disclosed comprising a computer-usable medium having control logic stored therein for causing an active antenna to execute a method for receiving a plurality of individual radio signals. The computer program product comprises first computer readable code means for causing the active antenna array to concurrently receive the plurality of individual radio signals, second computer readable code means for causing the active antenna array to centrally reduce a signal level of at least two of the plurality of individual radio signals, and third computer readable code means converting the plurality of individual radio signals from the analogue domain to the digital domain.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 2:
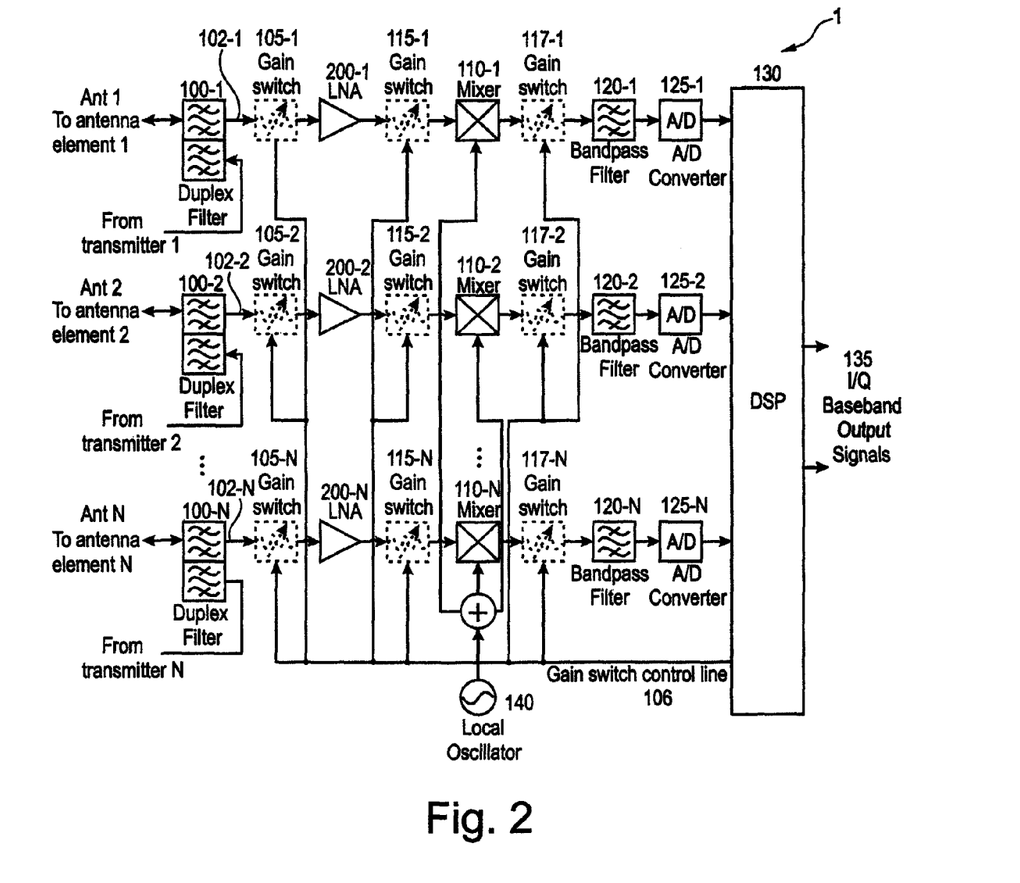
FIG. 2 shows a receiver system employing a common switching threshold and a common switching control for the receivers in an active antenna array.

FIG. 2 shows a first aspect of the invention applying a common switching threshold and a common switching control for all of the receivers in an active antenna array 1. It will be noted that the reference numerals for elements in each signal path in the active antenna array 1 are identical with each other, except that a suffix is added to the reference numeral to indicate the signal path in which the element is present. It will also be appreciated that similar reference numerals in each of the Figures are used for similar elements. For simplicity the suffixes will be omitted in the following description for those elements commonly referred.

The active antenna array 1 has a plurality of antenna elements Ant-1, Ant-2, . . . , Ant-N which are connected each to a receive signal path 102 through a duplex filter 100. The duplex filter 100 removes any out-off-band signals from the received radio signal from the antenna element Ant. It will be also noted that transmit signals are passed through the duplex filter prior to transmission from the antenna elements.

A gain switch 105 is connected to the output of the duplex filter 100 and to an input of a low noise amplifier 200. A control of the gain switch 105 is connected to an output of a digital signal processor 130 over a common gain switch control line 106, as will be explained later. The low noise amplifier 200 amplifies the received signals to form an amplified receive signal which can then be passed optionally to a second gain switch 115. The second gain switch 115 is also controlled through the gain switch control line 106 from the digital signal processor 130. An output of the second gain switch 115 is connected to an input of a first mixer 110. The amplified receive signal is downconverted in the mixer 110 with a signal from a first local oscillator 140. An output of the mixer 110 at a downconverted frequency is optionally passed through a third gain switch 117 (which is also controlled from the digital signal processor 130 through the gain switch control line 106) and then through a band pass filter 120 to an analogue-to-digital converter (ADC) 125 in which it is converted to a digital IF signal before being passed from its digital signal output to the digital signal processor 130. The digital IF signal is output from the digital signal processor 130 as a baseband output signal 135.

The aspect of the invention shown in FIG. 2 has three gain switches: A first gain switch 105, a second switch gain 115 and a third gain switch 117. It will be appreciated that it is not necessary to have all three of the gain switches 105, 115 and 117 in the receive signal path 102. It is merely required that one of the three gain switches 105, 115 or 117 is present which can attenuate the receive signal either in an amplified form, at the incoming radio frequency or at the downconverted frequency. The choice of the gain switch 105, 115 or 117 is one left to the designer of a circuit.

Each of the first gain switch 105, the second gain switch 115 and/or the third gain switch 117 is connected, as described above, by the gain switch control line to the digital signal processor 130. The digital signal processor 130 will monitor the digital signal output from the ADC 125 to determine whether the digital signals are close to a threshold level or not. In the event that any one of the digital signals is close to the threshold level, the digital signal processor 130 will output on the gain switch control line 106 an instruction to reduce or attenuate the receive signal at one or more of the first gain switch 105, the second gain switch 115 or the third gain switch 117. Each one of the gain switches 105, 115 or 117 in all of the receive signal paths 102-1, 102-2, . . . , 102-N are attenuated by substantially the same amount.

Figure 3:
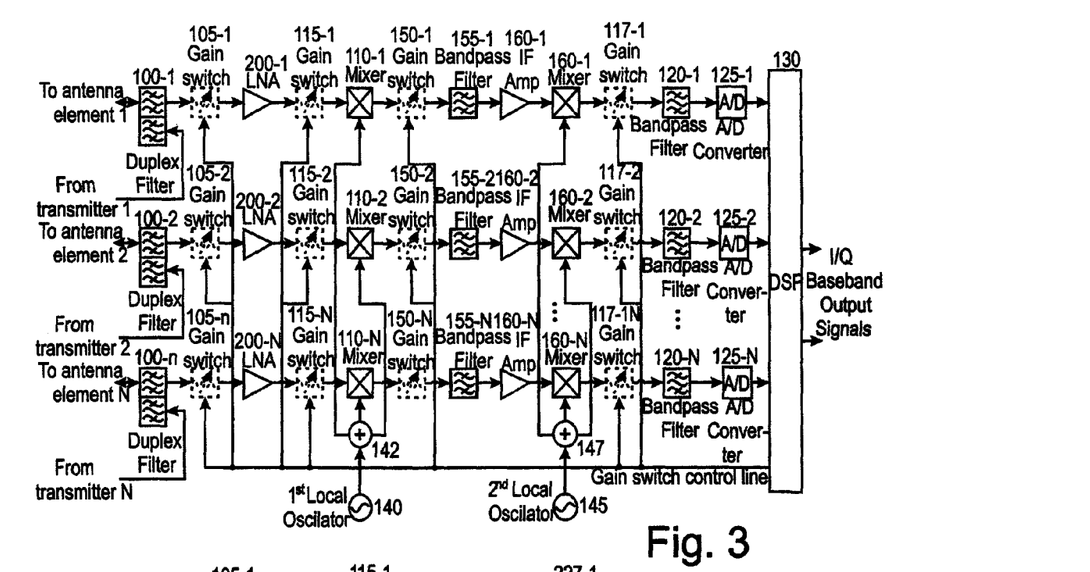
FIG. 3 shows an example of the common switching threshold in common switching control in a two-stage downconversion.

FIG. 3 shows a second aspect of the invention employing a two stage downconversion. It will be appreciated that the first stage conversion is identical with the aspect shown and described in connection with FIG. 3. The second stage down conversion employs a bandpass filter 155 to remove out-off-band signals from the first mixer 110 before the output signals from the first mixer 110 are passed to an IF amplifier 160 prior to further downconversion in a second mixer 160. The second mixer 160 is connected to a second local oscillator 145 and has output signals in the analogue domain which are passed through the bandpass filter 120 before being converted in the ADC 125.

The aspect shown in FIG. 3 has four possible gain switches: a first gain switch 105 between the duplex filter 100 and the low noise amplifier 100, a second gain switch 115 between the output of the low noise amplifier 200 and the input of the first mixer 110, a fourth gain switch 150 between the output of the first mixer 110 and an input of the second band pass filter 155 and finally a third gain switch 117 between an output of the second mixer 160 and an input of the first bandpass filter 120. As noted above it is not necessary for all of the four gain switches 105, 115, 150 or 117 to be present in each one of the receive signal paths 102. Similarly as noted above the gain switch control line 102 is connected to all of the four gain switches 105, 115, 150 and 117 in each one of the receive signal paths 102 to attenuate incoming receive signals to substantially the same amount on all of the receive signal paths 102.

Figure 4:
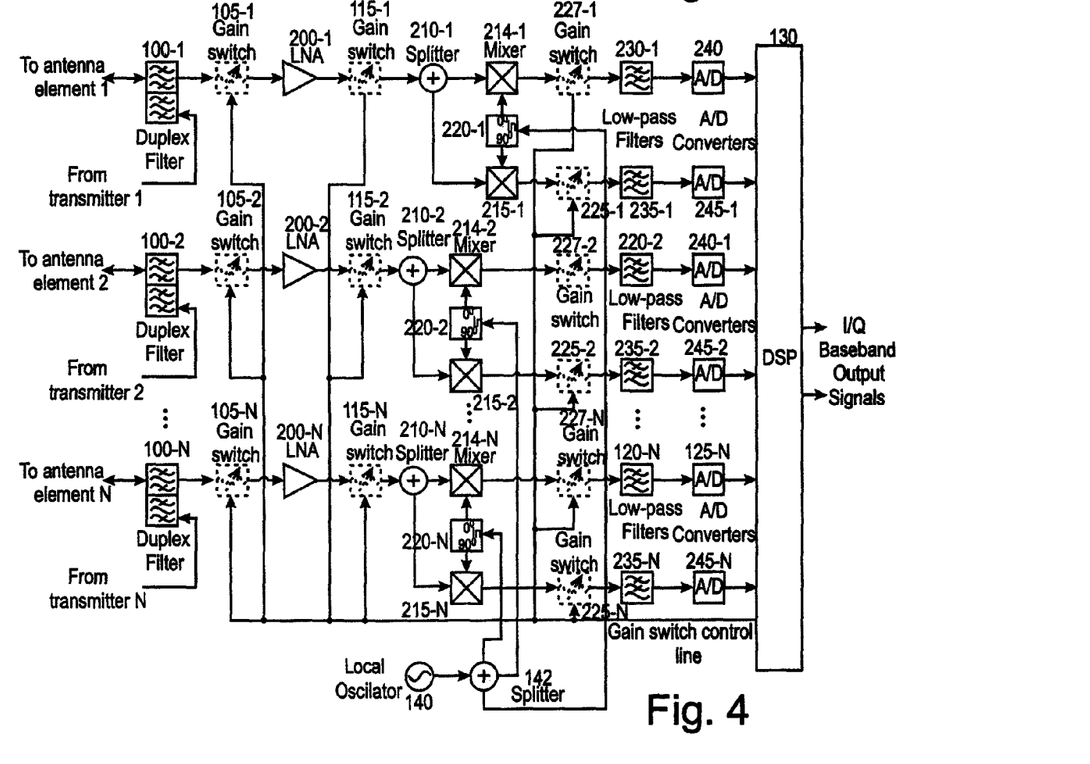
FIG. 4 shows another aspect of a common switching threshold for all elements.

FIG. 4 shows a further aspect of the invention employing a single downconversion process for the receive signals. In this Figure the first mixer 110 of FIG. 2 is replaced by a third mixer 214 and a fourth mixer 215 which receive the amplified (and possibly attenuated) receive signals from the low noise amplifier 200 through a third splitter 210. Both the third mixer 214 and the fourth mixer 215 are connected to the first local oscillator 140 through the first splitter 142 and a 90° phase shifter 220. The 90° phase shifter has two outputs: a first output passes the oscillator signal from the local oscillator 140 without any phase shift to the third mixer 214 and a second output from the 90° phase shifter passes the local oscillator signal with a 90° shift to the fourth mixer. The output of the third mixer 214 is therefore a downconverted I-component of the amplified (and possibly attenuated) received signal and the output of the fourth mixer 215 is a downconverted Q-component of the amplified (and possibly attenuated) receive signal. The output of the third mixer 214 is passed to a first low pass filter 230 to remove unwanted high frequency signals and thence to a second ADC 240 which digitises the downconverted I-component of the received signal and passes the downconverted I-component to the digital signal processor 130. Similarly the output of the fourth mixer 215 is connected to a second low pass filter 235 and thence to a third analogue to digital converter 245 for passing the two components of the receive signal to the digital output converter. It will be seen that there is optionally a fourth gain switch 225 between the output of the fourth mixer 215 and the second low pass filter 235. There is also an optional fifth gain switch 227 between the output of the third mixer 214 and the input of the first low pass filter 230.

Figure 5:
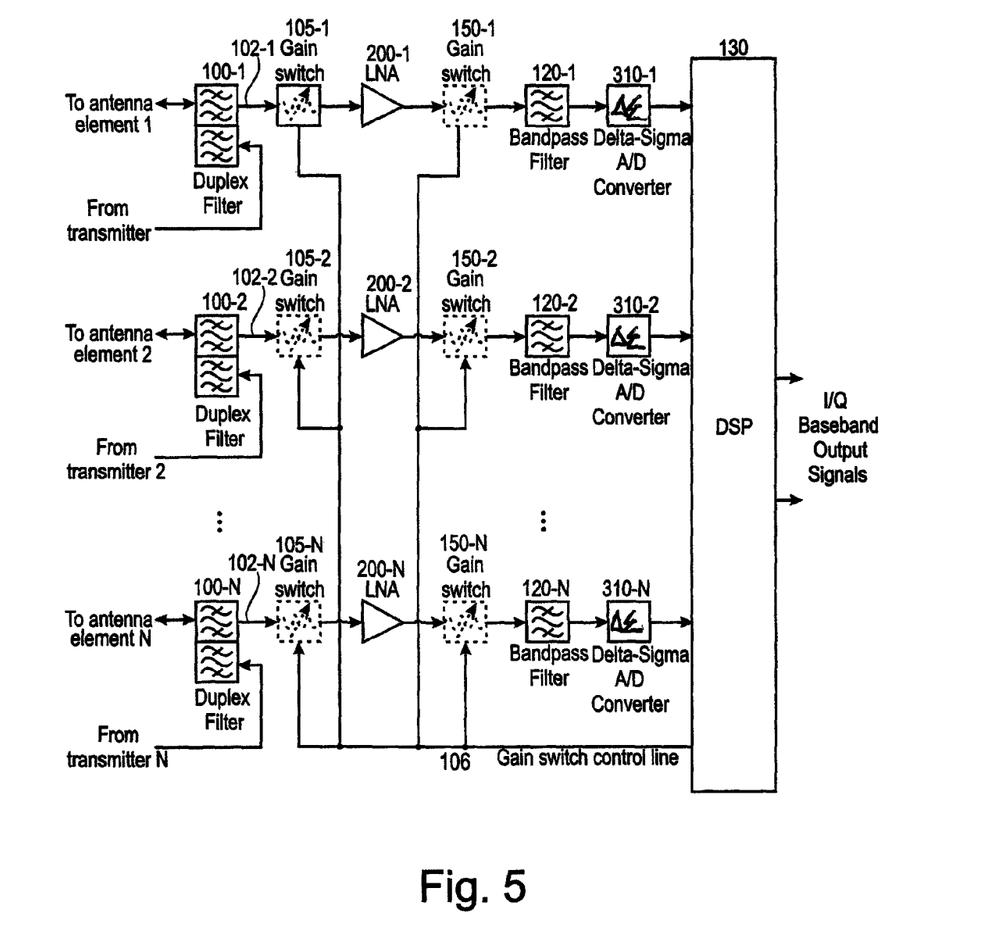
FIG. 5 shows a further aspect of a common switching threshold in common switching control for all elements in an antenna-embedded radio system.

FIG. 5 shows another aspect to the invention in which the first mixer 110 of the aspect illustrated in FIG. 2 is replaced by a delta-sigma converter 310. It will be appreciated that in this aspect of the invention there is no first mixer 110 present and therefore no local oscillator 140 present. The first gain switch 105 and/or a further gain switch 150 can be placed on either side of the low noise amplifier 200 which amplifies the receive signals. As noted above the amount of attenuation is controlled by a signal on the gain switch control line 106.

Figure 6:
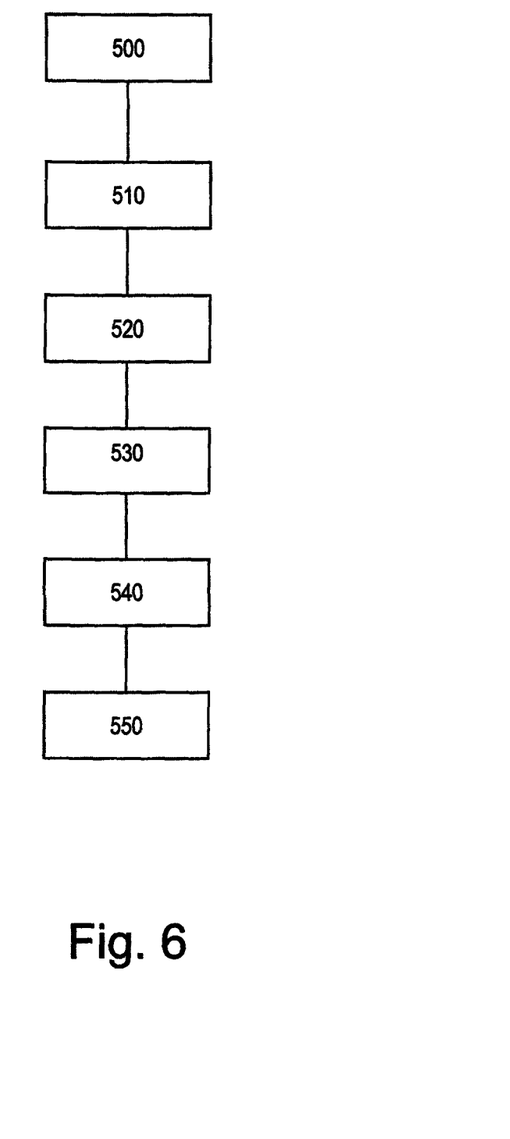
FIG. 6 shows a flow diagram illustrating the method for the receiving of the radio signals.

FIG. 6 shows a flow diagram illustrating the method for receiving a plurality of receive signals. In a first step 500 the receive signals are received at the plurality of antenna elements Ant. The amplitude of the plurality of individual receive signals may be reduced by attenuating the signal in 510 in one of the gain switches. It will be noted, as explained above, that substantially the same degree of attenuation is provided to all of the plurality of the receive signals. In step 520 the plurality of individual radio signals are converted from the analogue domain to the digital domain before being passed in step 530 to the digital signal processor 130.

In step 540 the digital signal processor 130 compares the amplitude of the digital signals with a threshold level and, if the amplitude is above or below the threshold level, a control signal will be issued in step 540 to at least one gain switch in each one of the receive signal paths 102. Depending on the control signal the amount of attenuation will be adjusted in step 550 in at least one of the gain switches in all of the receive signal paths 102 to ensure that the analogue digital converter in the receive signal path 102 operates correctly.

While various embodiments of the present invention have been described above, it should be understood that they have been presented by way of example, and not limitation. It will be apparent to persons skilled in the relevant arts that various changes in form and detail can be made therein without departing from the scope of the invention. In addition to using hardware (e.g., within or coupled to a central processing unit ("CPU"), micro processor, micro controller, digital signal processor, processor core, system on chip ("SOC") or any other device), implementations may also be embodied in software (e.g. computer readable code, program code, and/or instructions disposed in any form, such as source, object or machine language) disposed for example in a computer useable (e.g. readable) medium configured to store the software. Such software can enable, for example, the function, fabrication, modelling, simulation, description and/or testing of the apparatus and methods describe herein. For example, this can be accomplished through the use of general program languages (e.g., C, C++), hardware description languages (HDL) including Verilog HDL, VHDL, and so on, or other available programs. Such software can be disposed in any known computer useable medium such as semiconductor, magnetic disc, or optical disc (e.g., CD-ROM, DVD-ROM, etc.). The software can also be disposed as a computer data signal embodied in a computer useable (e.g. readable) transmission medium (e.g., carrier wave or any other medium including digital, optical, analogue-based medium). Embodiments of the present invention may include methods of providing the apparatus described herein by providing software describing the apparatus and subsequently transmitting the software as a computer data signal over a communication network including the internet and intranets.

It is understood that the apparatus and method describe herein may be included in a semiconductor intellectual property core, such as a micro processor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. An active antenna array for a mobile communications network comprising:
   a plurality of antenna elements for relaying radio signals;
   a plurality of first amplifiers for amplifying a plurality of individual receive signals and having outputs;
   a plurality of first analogue-to-digital converters for digitally converting the plurality of individual receive signals;
   a plurality of first gain switches, one of the first gain switches located between one of the plurality of antenna elements and one of the plurality of first amplifiers, a first gain switch of the plurality of first gain switches being adapted to attenuate the corresponding receive signal of the plurality of individual receive signals;
   a plurality of second gain switches, at least one of the second gain switches being located between at least one of the outputs of the plurality of first amplifiers and at least one of the plurality of first analogue-to-digital converters; and
   a digital signal processor connected to outputs of the plurality of first analogue-to-digital converters and having a common gain switch control line connected to at least two of the plurality of first gain switches and of the plurality of second gain switches, wherein the digital signal processor is adapted to compare the converted ones of the plurality of individual receive signals with a threshold value and to output, on the common gain switch control line, an instruction dependent on the comparison to attenuate a receive signal at the at least two of the plurality of first gain switches or the plurality of second gain switches, thereby applying a common switching control of the at least two of the plurality of first gain switches and of the plurality of second gain switches.

2. The active antenna array of claim 1, further comprising:
a plurality of first mixers connected between the outputs of the plurality of first amplifiers and the digital signal processor, the plurality of first mixers downconverting the plurality of individual receive signals from a first frequency to a second frequency.

3. The active antenna array of claim 2, wherein the plurality of second gain switches is connected between the outputs of the plurality of first amplifiers and the plurality of first mixers.

4. The active antenna array of claim 2, further comprising:
a plurality of bandpass filters connected between the plurality of first mixers and the digital signal processor.

5. The active antenna array of claim 4, further comprising:
third gain switches connected between the plurality of first mixers and the plurality of bandpass filters.

6. The active antenna array of claim 1, further comprising:
the plurality of analogue-to-digital converters is connected between the plurality of first amplifiers and the digital signal processor.

7. The active antenna array of claim 1, further comprising:
first local oscillator connected through a splitter to the plurality of first mixers.

8. The active antenna array of claim 2, further comprising:
a plurality of second amplifiers connected between the plurality of first mixers and the digital signal processor.

9. The active antenna array of claim 8, further comprising:
a plurality of second mixers connected between the plurality of the second amplifiers and the digital signal processor.

10. The active antenna array of claim 9, further comprising:
a second local oscillator connected to the plurality of second mixers through a second splitter.

11. The active antenna array of claim 8, further comprising:
a plurality of third gain switches connected between the plurality of second mixers and the digital signal processor and connected to the gain switch control line.

12. The active antenna array of claim 8, further comprising:
a plurality of fourth gain switches connected between the plurality of first mixers and the plurality of second amplifiers and connected to the gain switch control line.

13. The active antenna array of claim 1, further comprising:
a plurality of third splitters for splitting the plurality of individual receive signals into an I component and a Q component;
a plurality of third mixers for downconverting the I component and connected through a delay element to the first local oscillator; and
a plurality of fourth mixers for downconverting the Q component and connected through the delay element to the first local oscillator.

14. The active antenna array of claim 13, further comprising:
a plurality of fourth gain switches connected between the plurality of third mixers and the digital signal processor and being connected to the gain switch control line;
plurality of fifth gain switches connected between the plurality of fourth mixers and the digital signal processor and being connected to the gain switch control line.

15. The active antenna array of claim 1, further comprising:
a plurality of delta-sigma converters being connected between the plurality of first gain switches and the digital signal processor.

16. A method for receiving a plurality of individual radio signals comprising:
concurrently receiving the plurality of individual radio signals;
centrally changing by a similar amount a signal level of at least two of the plurality of individual radio signals, by outputting, on a common gain switch control line, an instruction to attenuate a receive signal at at least two of a plurality of first gain switches and of a plurality of second gain switches, the plurality of first gain switches being located between a plurality of antenna elements for relaying radio signals and a plurality of first amplifiers for amplifying a plurality of individual receive signals and the plurality of second gain switches being located between outputs of the plurality of first amplifiers and a plurality of first analogue-to-digital converters, thereby applying a common switching control to the at least two of the plurality of first switches;
converting using the plurality of first analogue-to-digital converters the plurality of individual radio signals from the analogue domain to the digital domain;
comparing the converted ones of the plurality of individual radio signals with a threshold value; and
adjusting the value of the similar amount dependent on the comparison.

17. The method of claim 16, further comprising:
downconverting the plurality of individual radio signals from a first frequency to a second frequency prior to converting the plurality of radio signals.

18. The method of claim 17, further comprising:
centrally reducing a signal level of the plurality of individual radio signals at the first frequency; and
centrally reducing a signal level of the plurality of individual radio signals at the second frequency.

19. A chip set comprising:
a plurality of first amplifiers for amplifying a plurality of individual receive signals and having outputs;
a plurality of first analogue-to-digital converters for converting the plurality of individual receive signals;
a plurality of first gain switches located prior to the plurality of first amplifiers, a first gain switch of the plurality of first gain switches being adapted to attenuate the corresponding receive signal of the plurality of individual receive signal;
a plurality of second gain switches, at least one of the second gain switches being located between at least one of the outputs of the plurality of first amplifiers and at least one of the plurality of first analogue-to-digital converters; and
a digital signal processor connected to outputs of the plurality of first analogue-to-digital converters and having a common gain switch control line connected to at least two of the plurality of first gain switches and of the plurality of second gain switches, wherein the digital signal processor is adapted to compare the converted ones of the plurality of individual receive signals with a threshold value and to output, on the common gain switch control line, an instruction dependent on the comparison to attenuate a receive signal at the at least two of the plurality of first gain switches or the second gain switches, thereby applying a common switching control to the at least two of the plurality of first gain switches and of the plurality of second gain switches.

20. A computer program product comprising a non-transitory computer-usable medium having control logic stored therein for causing a computer to manufacture an active antenna array for a mobile communications network comprising:
a plurality of antenna elements for relaying radio signals;
a plurality of first amplifiers for amplifying a plurality of individual receive signals;

a plurality of first analogue-to-digital converters for converting the plurality of individual receive signals;

a plurality of first gain switches, one of the plurality of first gain switches located between one of the plurality of antenna elements and one of the plurality of first amplifiers, a first gain switch of the plurality of first gain switches being adapted to attenuate the corresponding receive signal of the plurality of individual receive signals;

a plurality of second gain switches, at least one of the second gain switches being located between at least one of the outputs of the plurality of first amplifiers and at least one of the plurality of first analogue-to-digital converters; and a digital signal processor connected to outputs of the plurality of first analogue-to-digital converters and having a gain switch control line connected to at least two of the plurality of first gain switches and of the plurality of second gain switches, the digital signal processor is adapted to compare the converted ones of the plurality of individual receive signals with a threshold value and to output, on the common gain switch control line, an instruction dependent on the comparison to attenuate a receive signal at the at least two of the plurality of first gain switches or the plurality of second gain switches, thereby applying a common switching control the at least two of the plurality of first gain switches and of the plurality of second gain switches.

21. A computer program product comprising a non-transitory computer-usable medium having control logic stored therein for causing an active antenna to execute a method for receiving a plurality of individual radio signals comprising:

first computer readable code means for causing the active antenna array to concurrently receive the plurality of individual radio signals;

second computer readable code means for causing the active antenna array to centrally change by a similar amount a signal level of at least two of the plurality of individual radio signals, by outputting, on a common gain switch control line, an instruction to attenuate a receive signal at at least two of the plurality of first gain switches and of the plurality of second gain switches, the plurality of first gain switches being located between a plurality of antenna elements for relaying radio signals and a plurality of first amplifiers for amplifying a plurality of individual receive signals and the plurality of second gain switches being located between outputs of the plurality of first amplifiers and a plurality of first analogue-to-digital converters, thereby applying a common switching control the at least two of the plurality of first gain switches or the plurality of second gain switches; and third computer readable code means for converting the plurality of individual radio signals from the analogue domain to the digital domain using the a plurality of first analogue-to-digital converters fourth computer readable code means for comparing the converted ones of the plurality of individual radio signals with a threshold value and adjusting the value of the similar amount dependent on the comparison.

* * * * *